United States Patent
Kelly et al.

(10) Patent No.: US 9,177,785 B1
(45) Date of Patent: Nov. 3, 2015

(54) THIN OXIDE FORMATION BY WET CHEMICAL OXIDATION OF SEMICONDUCTOR SURFACE WHEN THE ONE COMPONENT OF THE OXIDE IS WATER SOLUBLE

(71) Applicant: Taiwan Semiconductor Manufacturing Company Limited, Hsinchu (TW)

(72) Inventors: Andrew Joseph Kelly, Hsinchu County (TW); Yusuke Oniki, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/291,244

(22) Filed: May 30, 2014

(51) Int. Cl.
*H01L 21/00* (2006.01)
*H01L 21/02* (2006.01)
*H01L 29/423* (2006.01)
*H01L 21/28* (2006.01)

(52) U.S. Cl.
CPC .... *H01L 21/02236* (2013.01); *H01L 21/02241* (2013.01); *H01L 21/28255* (2013.01); *H01L 21/28264* (2013.01); *H01L 29/42364* (2013.01)

(58) Field of Classification Search
CPC ............... H01L 21/0223; H01L 21/02233; H01L 21/02343
See application file for complete search history.

(56) References Cited

U.S. PATENT DOCUMENTS 7,022,623 B2 *  4/2006  Weimer et al. ........ 257/E21.241

* cited by examiner

*Primary Examiner* — Richard Booth
(74) *Attorney, Agent, or Firm* — Jones Day

(57) ABSTRACT

A method of forming a semiconductor structure is provided. The method comprises mixing a water soluble substance with an aprotic solvent to form a solvent mixture and forming a thin layer of oxide around a semiconductor surface by performing wet chemical oxidation operations on the semiconductor surface with the solvent mixture. The aprotic solvent may comprise propylene carbonate, dimethyl sulfoxide, ethylene carbonate or diethyl carbonate. The water soluble substance may comprise $H_2O_2$, $O_3$, or parts per million (ppm) level $H_2O$. The method may further comprise removing the oxide from the semiconductor surface to reduce the roughness of the semiconductor surface. The method may further comprise forming a second thin layer of oxide around the semiconductor surface by performing wet chemical oxidation operations with the solvent mixture and removing the second layer of oxide from the semiconductor surface to smoothen the semiconductor surface.

18 Claims, 7 Drawing Sheets

THIN OXIDE FORMATION BY WET CHEMICAL OXIDATION OF SEMICONDUCTOR SURFACE WHEN THE ONE COMPONENT OF THE OXIDE IS WATER SOLUBLE

BACKGROUND

The technology described in this patent document relates generally to semiconductor devices and more particularly to forming a thin oxide layer on a semiconductor surface.

Scaling of semiconductor devices, such as a metal-oxide semiconductor field-effect transistor (MOSFET), has enabled continued improvement in speed, performance, density, and cost per unit function of integrated circuits over the past few decades. Development of improved fabrication techniques can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
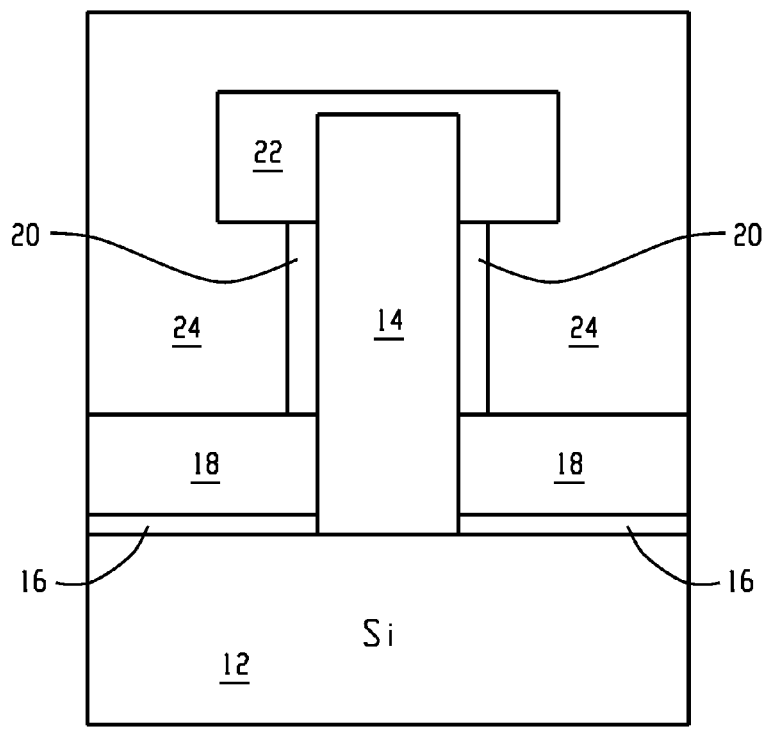
FIG. 1 is a cross sectional view of an example semiconductor structure having a thin oxide layer formed around a semiconductor surface, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross sectional view of an example semiconductor structure 10 having a thin oxide layer formed around a semiconductor surface. In this example, the oxide layer was formed using wet chemical oxidation of the semiconductor surface with one component of the oxide being water soluble. The example semiconductor structure comprises a silicon substrate 12, a vertically extending semiconductor channel region 14, an oxide layer 16 above the substrate 12, an insulator layer 18 above the oxide layer 16 and surrounding the channel region 14, a gate oxide layer 20 surrounding the semiconductor surface of the channel region 14, a second insulator layer above the gate oxide layer 20, and a metal gate layer 24 surrounding the gate oxide layer 20. The semiconductor surface of the channel region 14 may comprise Ge, SiGe, type III, or type IV material.

The gate oxide layer 20 is a thin layer of oxide formed around the semiconductor surface. In this example, the gate oxide layer 20 is approximately 0.7 nm in width. The thin layer of oxide was formed from wet chemical oxidation operations with a solvent mixture. The solvent mixture was formed by mixing a water soluble substance with an aprotic solvent. The aprotic solvent may comprise propylene carbonate (e.g., $C_4H_6O_3$), dimethyl sulfoxide, ethylene carbonate or diethyl carbonate. In this example, the aprotic solvent comprises propylene carbonate ($C_4H_6O_3$). The water soluble substance may comprise $H_2O_2$, $O_3$, or parts per million (ppm) level $H_2O$ mixed with the aprotic solvent.

Figure 2:
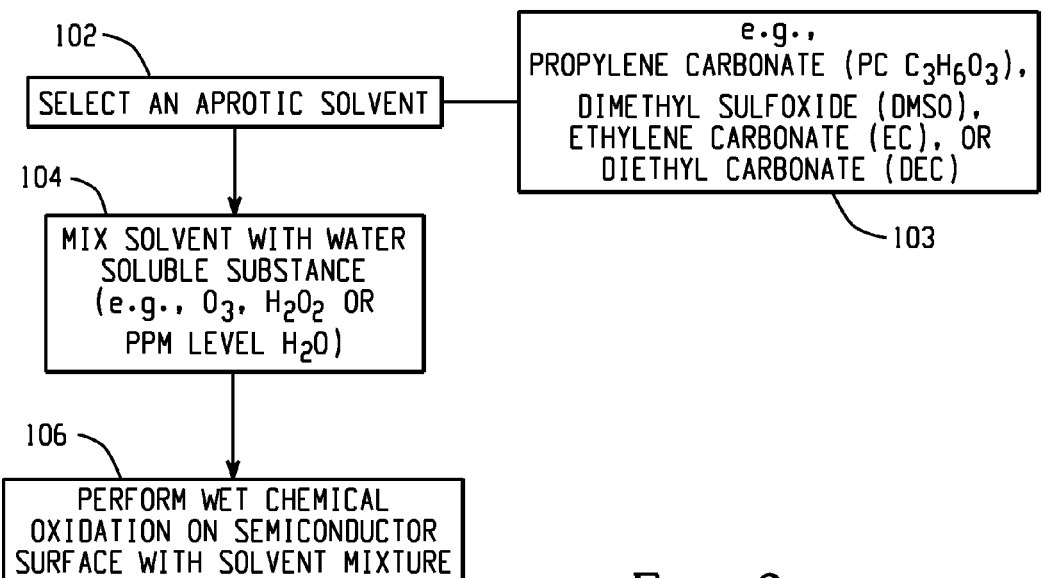
FIG. 2 is a process flow chart illustrating an example method of forming a semiconductor structure having a thin oxide layer formed around a semiconductor surface, in accordance with some embodiments.

FIG. 2 is a process flow chart illustrating an example method of forming a semiconductor structure having a thin oxide layer formed around a semiconductor surface. An aprotic solvent is selected (operation 102). Examples of aprotic solvents that may be used include propylene carbonate (e.g., $C_3H_6O_3$), dimethyl sulfoxide, ethylene carbonate, and diethyl carbonate (option 103). A selected aprotic solvent is mixed with a water soluble substance (operation 104), which forms a solvent mixture. Examples of water soluble substances that may be mixed with the aprotic solvent include $O_3$, $H_2O_2$, and ppm level $H_2O$. The resulting solvent mixture can be used in wet chemical oxidation operations on a semiconductor surface to form a thin oxide layer around the semiconductor surface (operation 106).

Figure 3:
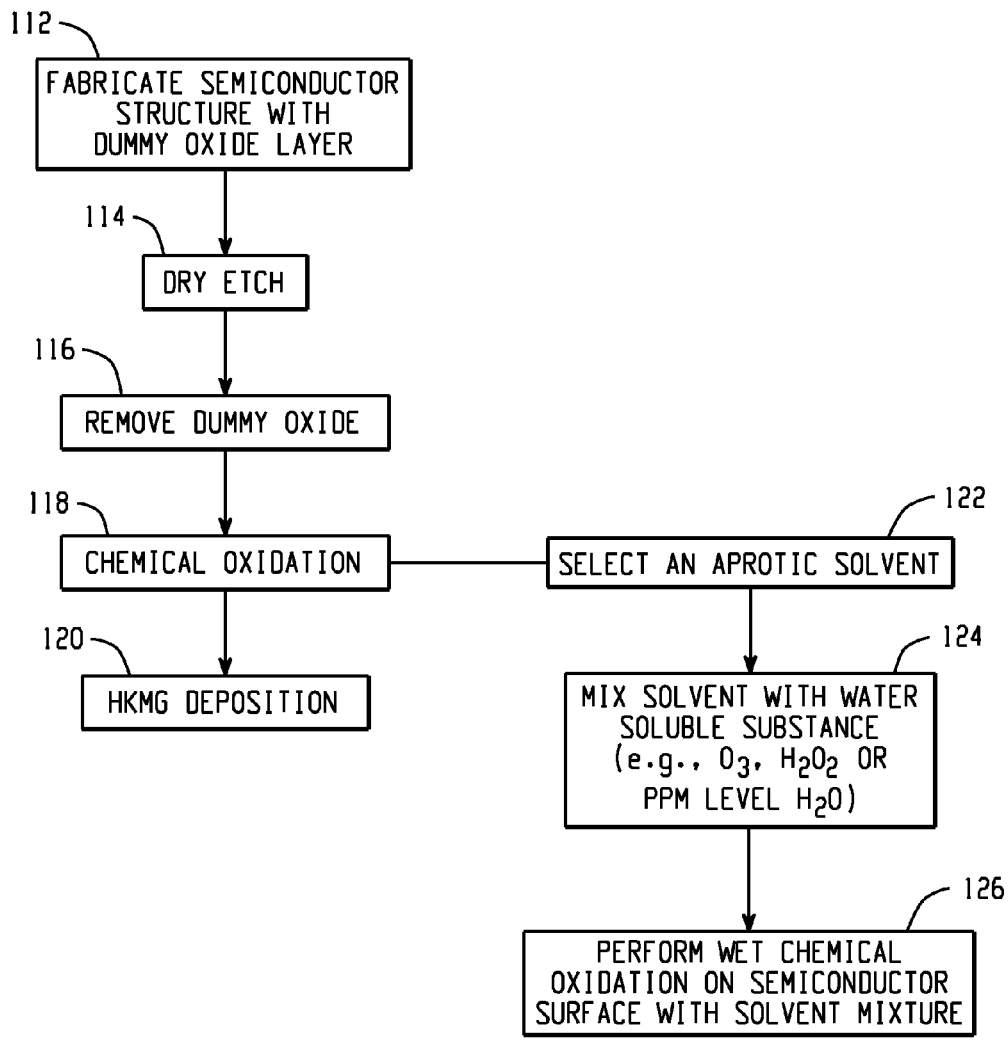
FIG. 3 is a process flow chart illustrating another example method of fabricating a semiconductor structure having a thin oxide layer formed around a semiconductor surface, in accordance with some embodiments.

FIG. 3 is a process flow chart illustrating another example method of fabricating a semiconductor structure having a thin oxide layer formed around a semiconductor surface. In this example, the surface comprises Ge, SiGe, type III, or type IV material. Also, in this example, a semiconductor structure having a metal gate is formed.

A partially fabricated semiconductor structure is fabricated comprising a substrate (e.g., a silicon substrate), a vertically extending semiconductor channel region, an oxide layer above the substrate, a first insulator layer above the oxide layer and surrounding the channel region, a dummy oxide layer (e.g., $SiO_2$) above the first insulator layer and surrounding the semiconductor surface of the channel region, and a second insulator layer above the dummy oxide layer (operation 112). Dry etch operations are performed to shape the second insulator layer (operation 114) by removing insulating material and some of the dummy oxide layer from the partially fabricated semiconductor structure. The dummy oxide layer is further removed (operation 116) from around the channel in the semiconductor structure. Chemical oxidation operations are utilized to form a thin oxide layer around the semiconductor surface of the vertically extending channel region (operation 118). The layer of oxide, in this example, is approximately 0.7 nanometers in width or less. Metal gate formation operations are performed to form a metal gate around the thin oxide layer and channel region (operation 120).

The chemical oxidation operations (operation 118) in this example are performed by selecting an aprotic solvent (operation 122), mixing the aprotic solvent with a water soluble substance (operation 124), which forms a solvent mixture, and performing wet chemical oxidation operations on the semiconductor surface with the solvent mixture (operation 126) to form a thin oxide layer around the semiconductor surface.

Examples of aprotic solvents that may be used include propylene carbonate (e.g., $C_3H_6O_3$), dimethyl sulfoxide, ethylene carbonate, and diethyl carbonate. Examples of water soluble substances that may be mixed with the aprotic solvent include $O_3$, $H_2O_2$, and ppm level $H_2O$.

FIGS. 4A through 4E are cross sectional views during various phases of fabrication of a semiconductor structure having a thin oxide layer formed around a semiconductor surface and a metal gate formed around the thin oxide layer and the semiconductor surface of a vertical extending channel.

Figure 4A:
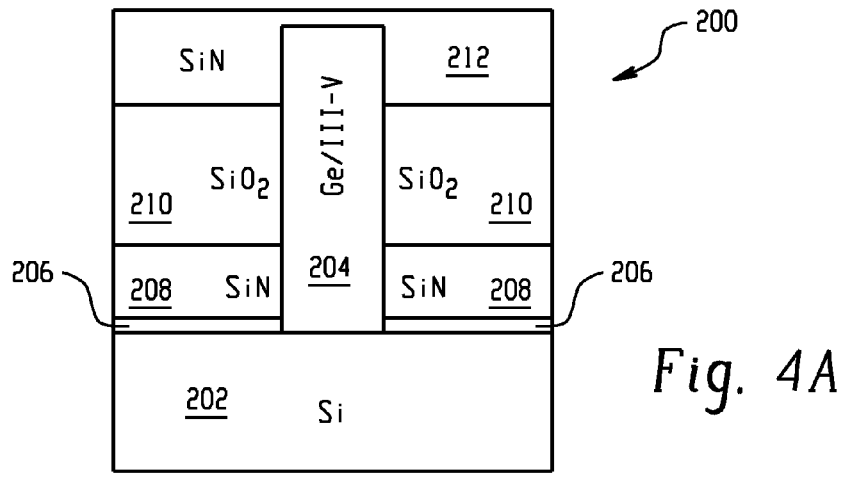
FIGS. 4A through 4E are cross sectional views during various phases of fabrication of a semiconductor structure having a thin oxide layer formed around a semiconductor surface and a metal gate formed around the thin oxide layer and the semiconductor surface of a vertical oriented channel, in accordance with some embodiments.
Figure 4B:
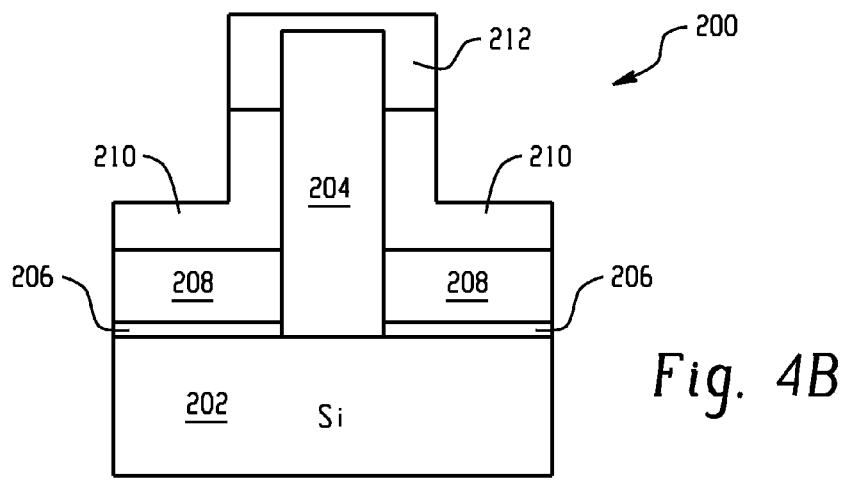
Figure 4C:
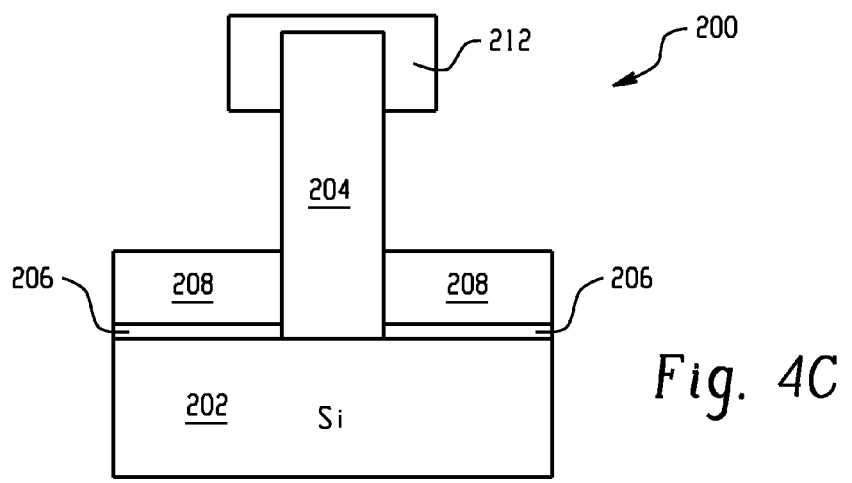
Figure 4D:
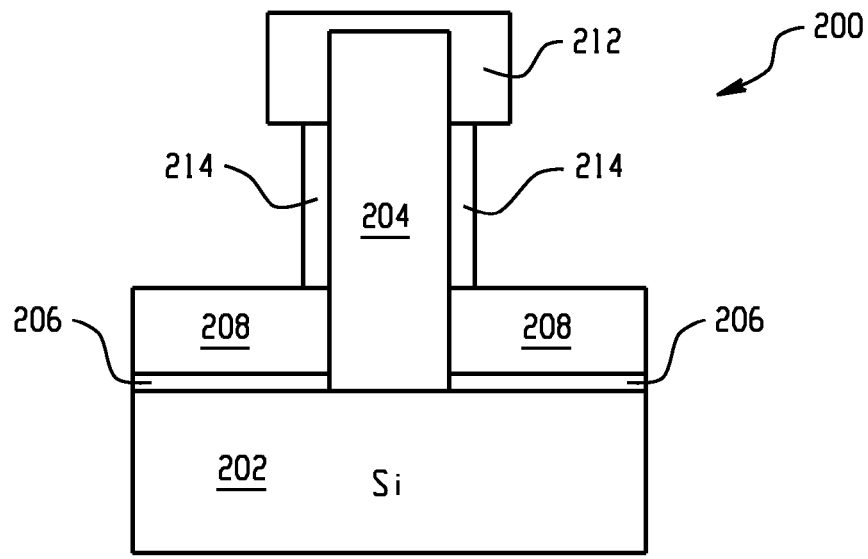
Figure 4E:
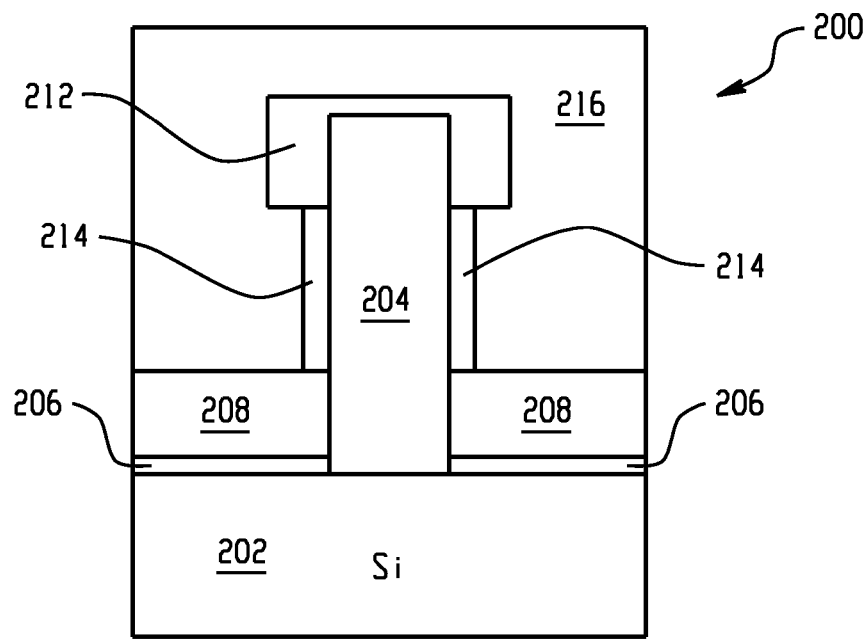

Depicted in FIG. 4A is a cross sectional view of an example semiconductor structure 200 comprising a substrate 202 (e.g., a silicon substrate), a vertically extending semiconductor channel region 204, an oxide layer 206 above the substrate, a first insulator layer 208 (e.g., a SiN layer) above the oxide layer 206 and surrounding the channel region 204, a dummy oxide layer 210 (e.g., $SiO_2$) above the first insulator layer 208 and surrounding the semiconductor surface of the channel region 204, and a second insulator layer 212 (e.g., a SiN layer) above the dummy oxide layer 210. Depicted in FIG. 4B is a cross sectional view of the example semiconductor structure 200 after dry etch operations have been performed to shape the second insulator layer 212. Insulating material and some of the dummy oxide layer are removed from the partially fabricated semiconductor structure. Depicted in FIG. 4C is a cross sectional view of the example semiconductor structure 200 after removal of the dummy oxide layer. Depicted in FIG. 4D is a cross sectional view of the example semiconductor structure 200 after chemical oxidation operations are utilized to form a thin oxide layer 214 around the semiconductor surface of the vertically extending channel region 204. Depicted in FIG. 4E is a cross sectional view of the example semiconductor structure 200 after metal gate formation operations are performed to form a metal gate 216 around the thin oxide layer 214 and channel region 204.

Figure 5:
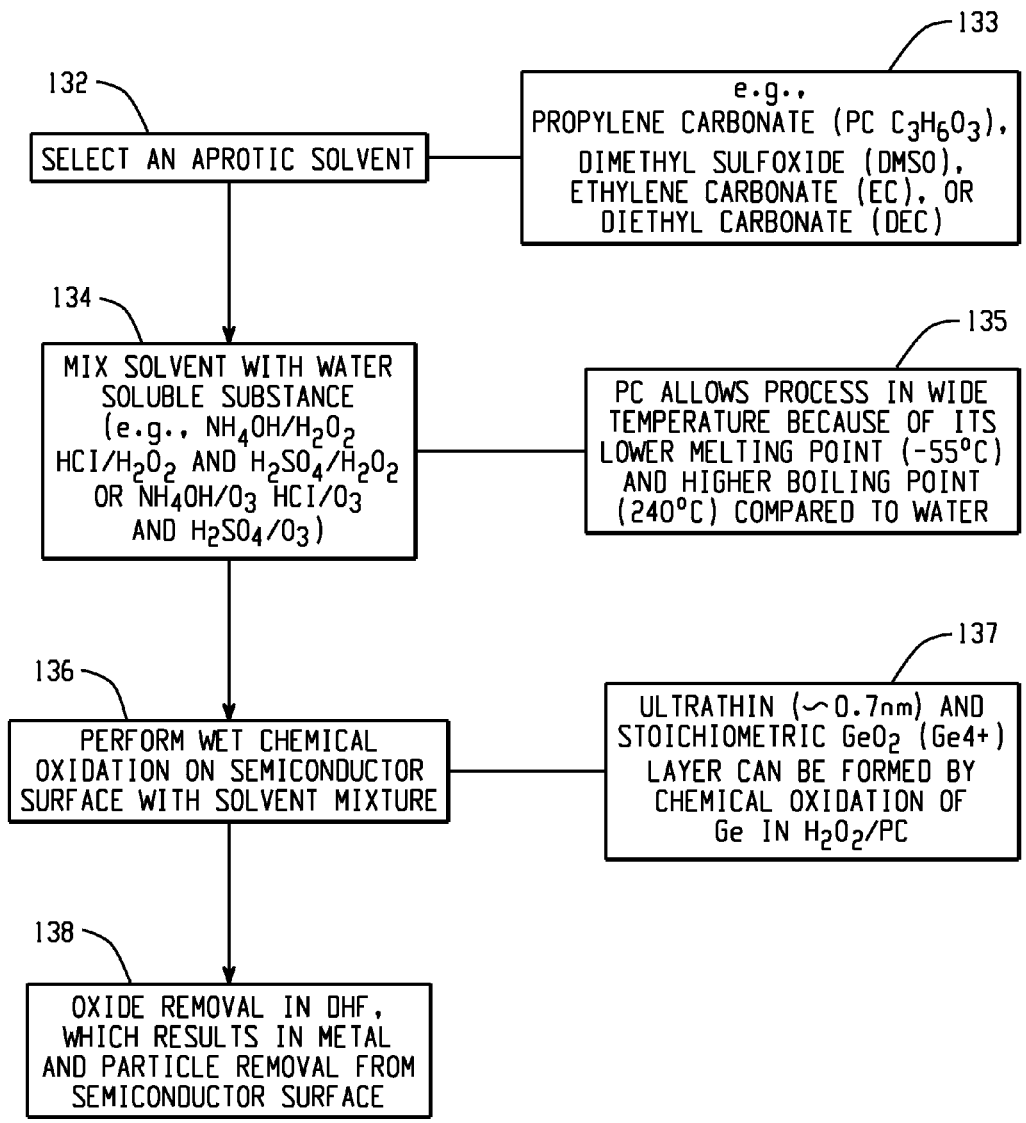
FIG. 5 is a process flow chart illustrating an example method of reducing the roughness of the surface of a semiconductor structure by removing metal and other particles from the semiconductor surface, in accordance with some embodiments.

FIG. 5 is a process flow chart illustrating an example method of reducing the roughness of the surface of a semiconductor structure by removing metal and other particles from the semiconductor surface. An aprotic solvents is selected (operation 132). Examples of aprotic solvents that may be used include propylene carbonate (e.g., $C_3H_6O_3$), dimethyl sulfoxide, ethylene carbonate, and diethyl carbonate (option 133). A selected aprotic solvent is mixed with a water soluble substance (operation 134), which forms a solvent mixture. Examples of water soluble substances that may be mixed with the aprotic solvent include $NH_4OH/H_2O_2$, $HCl/H_2O_2$, $H_2SO_4/H_2O_2$, $NH4OH/O_3$, $HCl/O_3$, and $H_2SO_4/O_3$. The use of propylene carbonate allows the process to operate in a wide temperature range because of its lower melting point (−55 C) and higher boiling point (240 C) compared to water (option 135). The resulting solvent mixture can be used in wet chemical oxidation operations on a semiconductor surface to form a thin oxide layer on the semiconductor surface (operation 136). A thin layer of approximately 0.7 nm and stoichiometric $GeO_2$ (Ge4+) layer can be formed by chemical oxidation of Ge in $H_2O_2$/PC (option 137). A dilute HF (DHF) cleaning solution may be used to remove the chemical oxide grown on the semiconductor surface during wet treatment (operation 138). The oxide removal results in metal and particle removal from the semiconductor surface.

Figure 6:
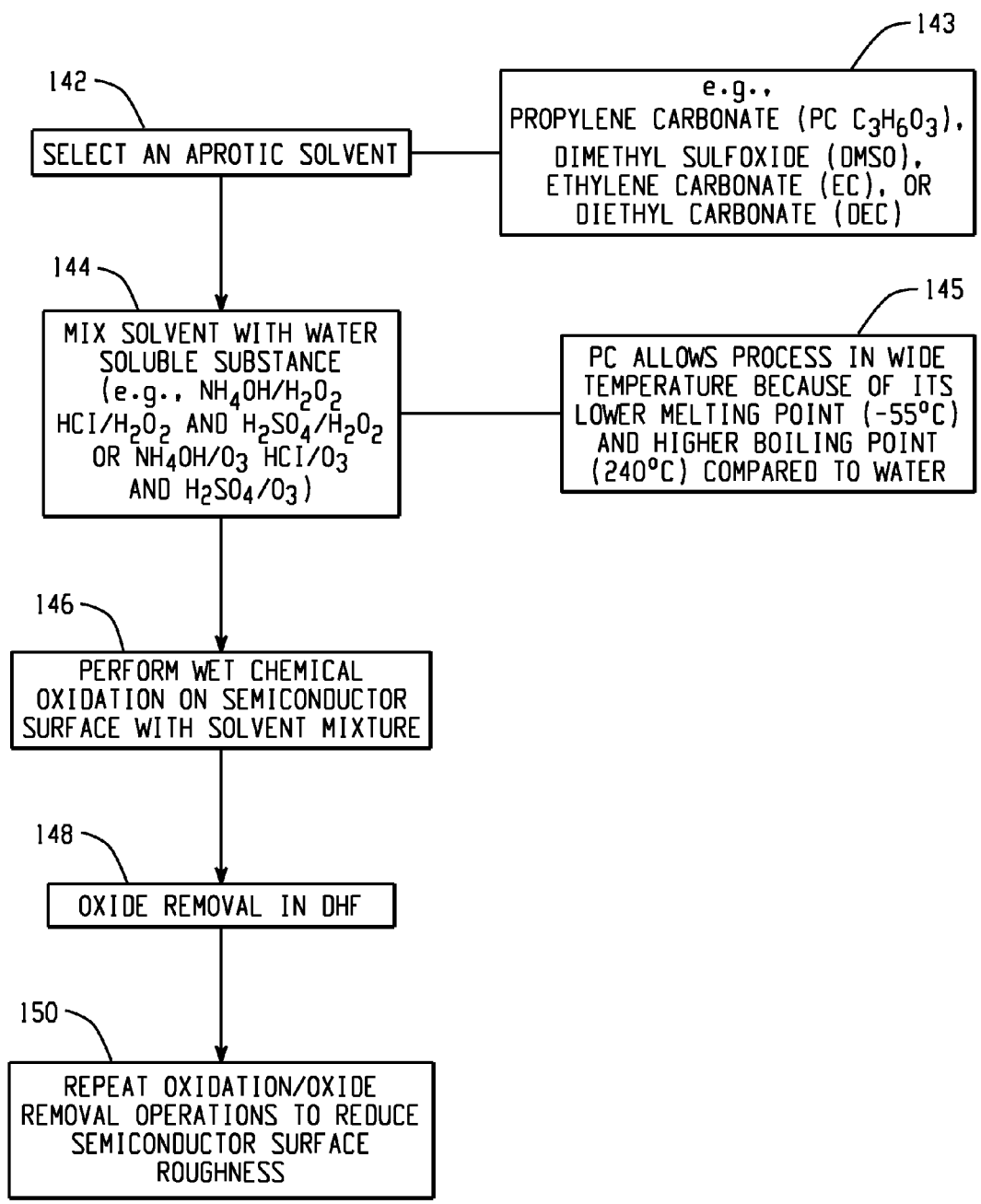
FIG. 6 is a process flow chart illustrating another example method of reducing the roughness of the surface of a semiconductor structure, in accordance with some embodiments.

FIG. 6 is a process flow chart illustrating another example method of reducing the roughness of the surface of a semiconductor structure. An aprotic solvent is selected (operation 142). Examples of aprotic solvents that may be used include propylene carbonate (e.g., $C_3H_6O_3$), dimethyl sulfoxide, ethylene carbonate, and diethyl carbonate (option 143). A selected aprotic solvent is mixed with a water soluble substance (operation 144), which forms a solvent mixture. Examples of water soluble substances that may be mixed with the aprotic solvent include $NH_4OH/H_2O_2$, $HCl/H_2O_2$, $H_2SO_4/H_2O_2$, $NH4OH/O_3$, $HCl/O_3$, and $H_2SO_4/O_3$. The use of propylene carbonate allows the process to operate in a wide temperature range because of the lower melting point (−55 C) and higher boiling point (240 C) compared to water (option 145). The resulting solvent mixture can be used in wet chemical oxidation operations on a semiconductor surface to form a thin oxide layer on the semiconductor surface (operation 146). A dilute HF (DHF) cleaning solution may be used to remove the chemical oxide grown on the semiconductor surface during wet treatment (operation 148). The oxide removal results in metal and particle removal from the semiconductor surface. Another solvent mixture can be used in wet chemical oxidation operations on the semiconductor surface to form a thin oxide layer on the semiconductor surface (operation 150). A dilute HF (DHF) cleaning solution may be used to remove the chemical oxide grown on the semiconductor surface during wet treatment (operation 150). These repeated oxidation/oxide removal operations can further reduce the semiconductor surface roughness. The oxidation/oxide removal operations may be repeated a number of times to obtain the desired semiconductor surface smoothness.

Figure 7:
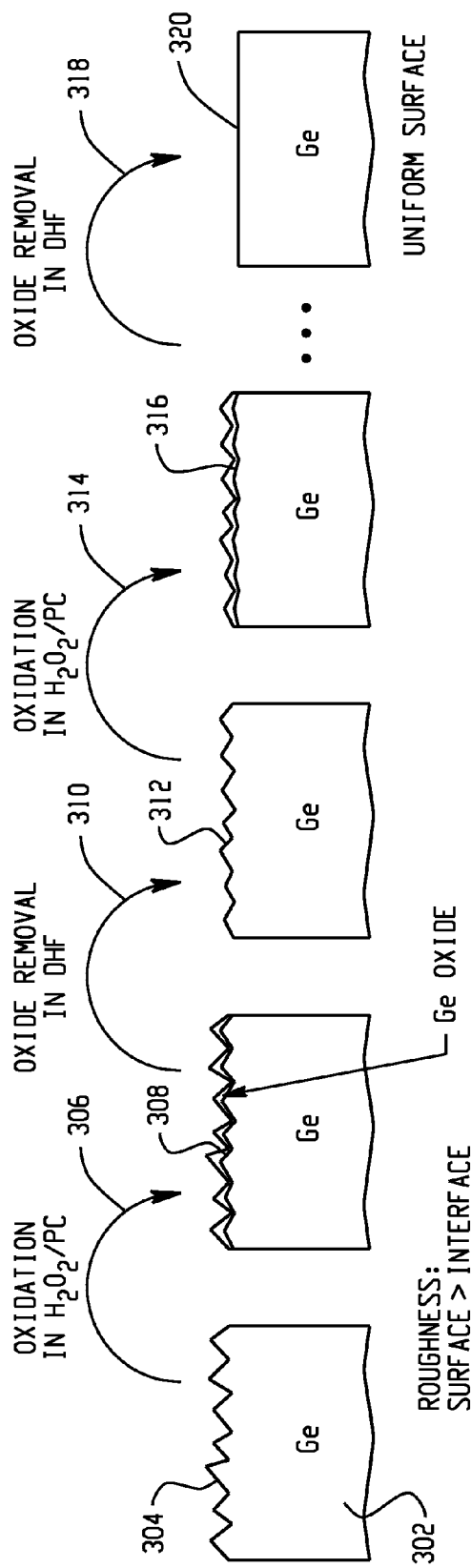
FIG. 7 is a diagram illustrating that repeated oxidation/oxide removal operations can systematically reduce the roughness of the semiconductor surface, in accordance with some embodiments.

FIG. 7 is a diagram illustrating that repeated oxidation/oxide removal operations can systematically reduce the roughness of a semiconductor surface. Structure 302 is a semiconductor structure made from Ge in this example that has a surface 304 with rough (or jagged edges). Wet chemical oxidation operations (operation 306) are applied to the semiconductor surface 304 to form a thin oxide layer 308 on the semiconductor surface. In this example, propylene carbonate (PC) is mixed with an $H_2O_2$ mixture to produce Ge oxide 308 on the surface 304 of the semiconductor structure 302. A dilute HF (DHF) cleaning solution is used to remove the chemical oxide 308 grown on the semiconductor surface (operation 310). The oxide removal results in metal and particle removal from the semiconductor surface. The removal of the Ge oxide 308 results in a semiconductor surface 312 with reduced roughness. Oxidation operations are repeated. Wet chemical oxidation operations (operation 314) are applied to the semiconductor surface 312 to form a thin oxide layer 316 on the semiconductor surface. The removal of the Ge oxide 316 results in a semiconductor surface with greater reduced roughness. The removal of the Ge oxide followed by additional oxidation operations may occur one or more additional times. The final oxide removal (operation 318) results in a semiconductor surface 320 with a much smoother surface.

Some of the described examples disclose a solvent based wet chemical oxidation method to prepare ultrathin stoichiometric oxide films on Ge, SiGe and III-V materials with minimal material loss. Some of the described examples provide a new process design for use with high mobility channel devices that may be performed at a low cost on wet clean tools, may be performed without damaging the semiconductor material, that are 3D FinFET and nanowire FET compatible, and that may be performed with low carbon content by $DIO_3$ or $H_2O_2$ Ultrathin oxides can be prepared with minimal etching to passivate chemically and electrically Ge, SiGe and III-V semiconductors with water soluble oxides. The oxide/semiconductor interface may have low density of interface states ($D_{it}$). Metal and other particles can be removed efficiently from Ge, SiGe and III-V surface without material loss. The surface roughness of Ge, SiGe and III-V channels can be reduced by sacrificial surface oxidation and the oxide removal, which enhance the carrier mobility and drive current.

In one embodiment, disclosed is a semiconductor structure comprising a semiconductor surface and a thin layer of oxide formed around the semiconductor surface. The thin layer of oxide was formed by mixing a water soluble substance with an aprotic solvent to form a solvent mixture and by performing wet chemical oxidation operations on the semiconductor surface with the solvent mixture.

These aspects and other embodiments may include one or more of the following features. The semiconductor structure may comprise a metal gate surrounding the oxide. The channel structure may be a vertically extending channel structure. The aprotic solvent may comprise propylene carbonate, dimethyl sulfoxide, ethylene carbonate or diethyl carbonate. The water soluble substance may comprise $H_2O_2$, $O_3$, or parts per million (ppm) level $H_2O$. The semiconductor surface may comprise Ge, SiGe, type III, or type IV material.

In another embodiment, a method of forming a semiconductor structure is provided. The method comprises mixing a water soluble substance with an aprotic solvent to form a solvent mixture and forming a thin layer of oxide around a semiconductor surface by performing wet chemical oxidation operations on the semiconductor surface with the solvent mixture.

These aspects and other embodiments may include one or more of the following features. The semiconductor surface may be the surface of a channel structure. The method may further comprise forming a metal gate around the oxide. The channel structure may be a vertically oriented channel structure. The aprotic solvent may comprise propylene carbonate, dimethyl sulfoxide, ethylene carbonate or diethyl carbonate. The water soluble substance may comprise $H_2O_2$, $O_3$, or parts per million (ppm) level $H_2O$. The method may further comprise removing the oxide from the semiconductor surface to reduce the roughness of the semiconductor surface. The method may further comprise forming a second thin layer of oxide around the semiconductor surface by performing wet chemical oxidation operations with the solvent mixture and removing the second layer of oxide from the semiconductor surface to smoothen the semiconductor surface.

In another embodiment, a method of forming a semiconductor structure is disclosed. The method comprises removing insulating material from a partially fabricated semiconductor structure using etching operations, removing dummy oxide material from around a channel in the semiconductor structure, mixing a water soluble substance with an aprotic solvent to form a solvent mixture, forming a thin layer of oxide around a semiconductor surface in the semiconductor structure by performing wet chemical oxidation operations on the semiconductor surface with the solvent mixture, and forming a metal gate around the oxide.

These aspects and other embodiments may include one or more of the following features. The semiconductor surface may be the surface of a channel structure. The method may further comprise forming a metal gate around the oxide. The channel structure may be a vertically extending channel structure. The aprotic solvent may comprise propylene carbonate, dimethyl sulfoxide, ethylene carbonate or diethyl carbonate. The water soluble substance may comprise $H_2O_2$, $O_3$, or parts per million (ppm) level $H_2O$. The semiconductor surface may comprise Ge, SiGe, type III, or type IV material. The layer of oxide may be approximately 0.7 nanometers in width or less.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure comprising:
   forming a solvent mixture by mixing a water soluble substance with an aprotic solvent; and
   forming a thin layer of oxide over a semiconductor surface by performing wet chemical oxidation operations on the semiconductor surface with the solvent mixture.

2. The method of claim 1, wherein the semiconductor surface comprises surface of a channel structure, and the method further comprising forming a metal gate over the thin layer of oxide.

3. The method of claim 2, wherein the channel structure is a vertically oriented channel structure, wherein forming the thin layer of oxide comprises forming the thin layer of oxide on a lateral surface of the vertically oriented channel structure.

4. The method of claim 1, wherein forming the solvent mixture comprises using aprotic solvent that includes at least one of propylene carbonate, dimethyl sulfoxide, ethylene carbonate of and diethyl carbonate.

5. The method of claim 1, wherein forming the solvent mixture comprises using water soluble substance that includes at least one of $H_2O_2$, $O_3$, and parts per million (ppm) level $H_2O$.

6. The method of claim 1, further comprising removing the oxide from the semiconductor surface to reduce the roughness of the semiconductor surface.

7. The method of claim 6, further comprising forming a second thin layer of oxide around the semiconductor surface by performing wet chemical oxidation operations with the solvent mixture and removing the second layer of oxide from the semiconductor surface to smoothen the semiconductor surface.

8. A method of forming a semiconductor structure comprising:
   removing insulating material from a partially fabricated semiconductor structure using etching operations;
   removing dummy oxide material from around a channel in the semiconductor structure;
   mixing a water soluble substance with an aprotic solvent to form a solvent mixture;
   forming a thin layer of oxide around a semiconductor surface in the semiconductor structure by performing wet chemical oxidation operations on the semiconductor surface with the solvent mixture; and
   forming a metal gate around the oxide.

9. The method of claim 8, wherein the semiconductor surface comprises the surface of a channel structure and further comprising forming a metal gate around the oxide.

10. The method of claim 9, wherein the channel structure is a vertically extending channel structure.

11. The method of claim 8, wherein the aprotic solvent comprises propylene carbonate, dimethyl sulfoxide, ethylene carbonate or diethyl carbonate.

12. The method of claim 8, wherein the water soluble substance comprises $H_2O_2$, $O_3$, or parts per million (ppm) level $H_2O$.

13. The method of claim 8, wherein the semiconductor surface comprises Ge, SiGe, type III, or type IV material.

14. The method of claim 8, wherein the layer of oxide is approximately 0.7 nanometers in width or less.

15. The method of claim 9, wherein the channel structure is a vertical nano-channel structure, wherein forming the thin layer of oxide comprises forming the thin layer of oxide around a selective lateral portion of the channel structure.

16. The method of claim 15, further comprising forming a gate structure around the thin layer of oxide.

17. The method of claim of claim 1, wherein forming a thin layer of oxide over the semiconductor surface comprises performing wet chemical oxidation operation with the solvent mixture on the semiconductor surface of at least one of Ge, SiGe, type III, and type IV materials.

18. The method of claim 1, wherein forming a thin layer of oxide over the semiconductor surface comprises forming a thin layer of oxide having a thickness no larger than 0.7 nanometer.

* * * * *